United States Patent [19]

Shiba et al.

[11] Patent Number: 4,839,862
[45] Date of Patent: Jun. 13, 1989

[54] STATIC RANDOM ACCESS MEMORY HAVING BI-CMOS CONSTRUCTION

[75] Inventors: Hiroshi Shiba; Shoji Eguchi, both of Tokyo, Japan

[73] Assignee: NEC Corporation, Tokyo, Japan

[21] Appl. No.: 85,575

[22] Filed: Aug. 14, 1987

[30] Foreign Application Priority Data

Aug. 15, 1986 [JP] Japan .................................. 61-191321
Aug. 15, 1986 [JP] Japan .................................. 61-191322
Aug. 15, 1986 [JP] Japan .................................. 61-191323

[51] Int. Cl.$^4$ .......................... G11C 7/02; G11C 11/40
[52] U.S. Cl. ...................................... 365/154; 365/177; 365/208
[58] Field of Search ............... 365/154, 155, 156, 177, 365/179, 207, 208

[56] References Cited

U.S. PATENT DOCUMENTS 4,658,159  4/1987  Miyamoto ........................... 365/208

FOREIGN PATENT DOCUMENTS 0142594  6/1986  Japan ................................... 365/177

OTHER PUBLICATIONS

Nikkei Electronics 1986, 3, 10, pp. 199–217.

Primary Examiner—James W. Moffitt
Attorney, Agent, or Firm—Sughrue, Mion, Zinn, Macpeak and Seas

[57] ABSTRACT

A semiconductor memory of a Bi-CMOS construction is disclosed. The memory includes a plurality of cell blocks connected in common to a pair of main-bit lines. Each of the cell blocks includes a plurality of word lines, a pair of pre-bit lines, a plurality of memory cell each connected to one of the word lines and to the pre-bit lines, and a pair of bipolar transistors having the respective bases connected to the pre-bit lines and the respective collector-emitter current paths connected in series between the main-bit lines. One of the bipolar transistors is turned ON in response to data stored in a selected memory cell to discharge the associated main-bit line. The discharging of the pre-bit line and the main-bit line is thus carried out rapidly to increase data read operation speed.

7 Claims, 5 Drawing Sheets

STATIC RANDOM ACCESS MEMORY HAVING BI-CMOS CONSTRUCTION

BACKGROUND OF THE INVENTION

The present invention relates to a semiconductor memory and, more particularly, to a random access memory of a static type having bipolar transistors and complementary MOS transistors.

Utilizing advantages of both a bipolar transistor circuit and a complementary MOS transistor circuit, it was disclosed in NIKKEI ELECTRONICS, Mar. 10, 1986, at page 199 to 217 to construct a static type random access memory by bipolar transistors and CMOS transistors. Such a memory is called "Bi-CMOS" SRAM. In the Bi-CMOS SRAM disclosed, peripheral circuits such as an address buffer, a decoder/driver, a sense amplifier and an output circuit are constructed by Bi-CMOS transistor circuits and a memory cell array is constructed by an N-channel MOS transistor circuit. As a result, an operation speed of each peripheral circuit is improved, while realizing a low power consumption and a high integration.

However, a memory cell array of the Bi-CMOS SRAM is the same as that of a conventional SRAM constructed only by MOS transistors, and therefore an operation speed of the cell array is not improved. More specifically, a great number of memory cells are connected in common to each pair of bit lines. For this reason, these bit lines are prolonged, so that they have a large stray capacitance. One of each pair of bit lines is discharged in accordance with the data stored in a selected memory cell, and the discharging of the bit line is carried out by a MOS transistor contained in the selected memory cell. However, the MOS transistors generally have a relatively low current ability. Moreover, the MOS transistor is formed in a fine pattern to decrease the size of the memory cell. Therefore, the current ability of the MOS transistor in the memory cell is very small, so that the bit line is discharged with a large time constant. As a result, the improvement in the operation speed of the Bi-CMOS SRAM is restricted.

SUMMARY OF THE INVENTION

Therefore, an object of the present invention is to provide a semiconductor memory in which an operation speed of a memory cell portion is improved.

Another object of the present invention is to provide a Bi-CMOS SRAM attaining a data read operation at a very high speed.

A semiconductor memory according to the present invention comprises a plurality of cell blocks, each of the cell blocks including a plurality of word lines, a pair of pre-bit lines, a plurality of memory cells each connected to one of the word lines and to the pre-bit lines, first, second and third nodes, a first transistor of a bipolar type having a base connected to one of the pre-bit lines and a collector-emitter current path connected between the first and third nodes, a second transistor of the bipolar type having a base connected to the other of the pre-bit lines and a collector-emitter current path connected between the second and third nodes, and a third transistor connected between the third node and a reference point; a pair of main-bit lines connected respectively to the first and second nodes of each of the cell blocks; and means responsive to a set of address signals for selecting one of the word lines in one of the cell blocks and for turning ON the third transistor in the one of the cell blocks.

According to the invention, a great number of memory cells arranged in the same column are divided into a plurality of cell blocks and the bit line is divided into the pre-bit line and the main-bit line. Accordingly, the number of memory cells connected in common to the pre-bit line is reduced, so that a stray capacitance of the pre-bit line is made small. The discharging of the pre-bit line is thereby carried out with a small time constant by a selected memory cell. All of the cell blocks in each column are connected to the main-bit lines whose capacitances are also reduced as compared conventional bit line structure due to the reduction in transistors connected thereto. Moreover, the first or second transistor of the bipolar type discharges one of the main-bit lines in response to a potential difference between the pre-bit lines. The bipolar transistor has a large current ability. Accordingly, the discharging of the main-bit line is carried out with a small time constant. As a result, a potential difference appears between the main-bit lines within a short time in response to the data stored in tee selected memory cell. The data read operation is thus performed at a high speed.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE EMBODIMENTS

Figure 1:
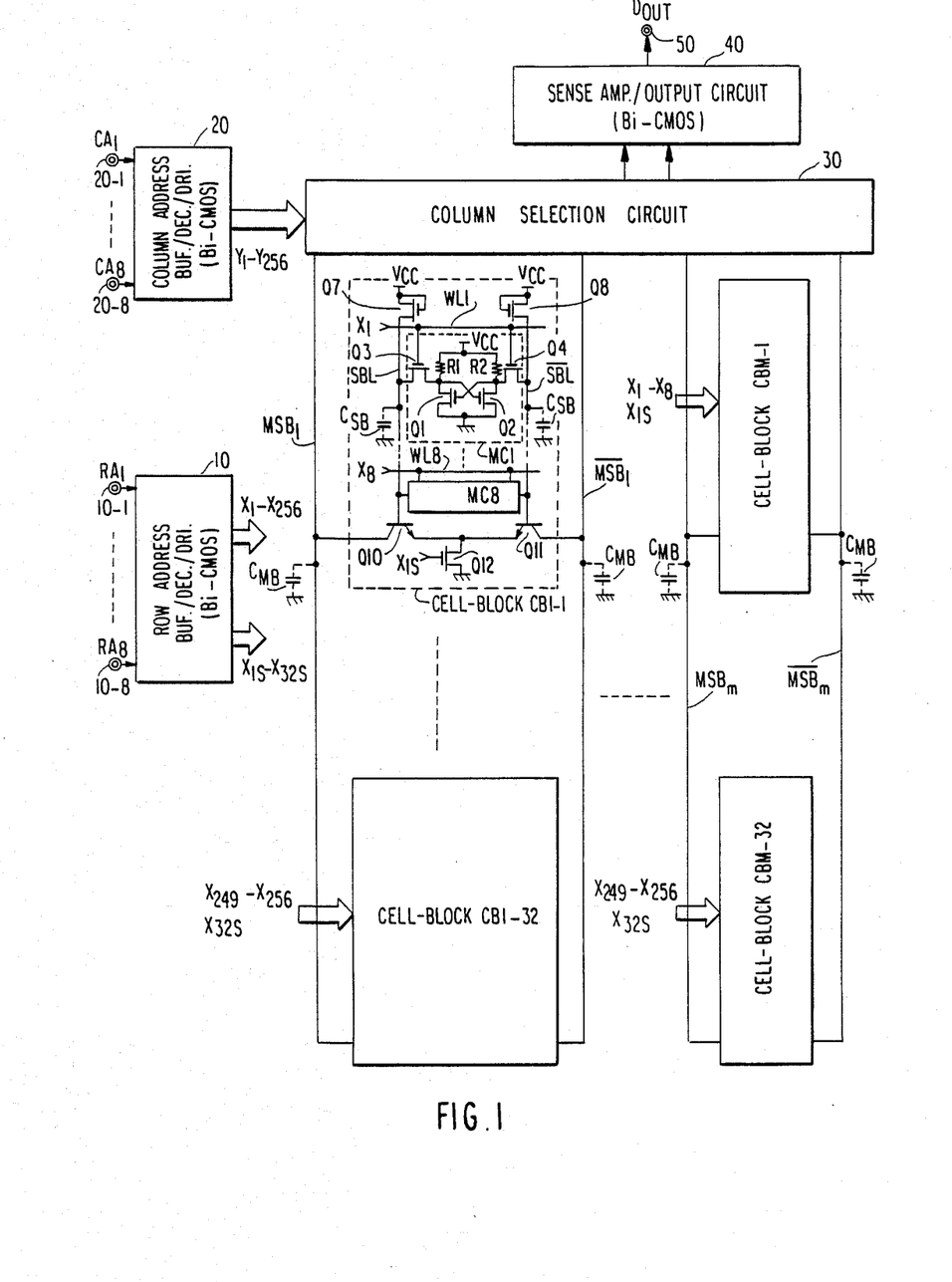
FIG. 1 is a block diagram showing a first embodiment of the present invention.

Referring to FIG. 1, a first embodiment of the present invention has a plurality of memory cells MC arranged in a known matrix form of N rows and M columns (N and M being integers) with N word lines in rows and M pairs of bit lines in columns. In this embodiment, N and M are 256, respectively. Accordingly, the memory shown in FIG. 1 has 65536 memory cells. The memory cells MC arranged in the same row are connected in common to one of 256 word lines $WL_1$ to $WL_{256}$. The memory cells arranged in the same column are divided into 32 cell blocks CB 1-1 to CB 1-32 (CB M-1 to CB M-32). Therefore, each of cell blocks includes eight memory cells, but two of them MC1 and MC8 are representively illustrated in FIG. 1. The cell blocks CB 1-1 to CB 1-32 (CB M-1 to CB M-32) arranged in the same column are connected to a pair of main-bit lines $MBL_1$ and $\overline{MBL}_1$ ($MBL_m$ and $\overline{MBL}_m$). Each cell block further includes a pair of pre-bit lines SBL and $\overline{SBL}$, a first bipolar NPN transistor $Q_{10}$ having a base connected to a true one (SBL) of the pre-bit lines, a second bipolar NPN transistor $Q_{11}$ having a base connected to a complementary one ($\overline{SBL}$) of the pre-bit lines and a collect-emitter current path connected in series of the collector-emitter current path between the main-bit lines MBL and $\overline{MBL}$ as shown, a third transistor of an N-channel MOS type connected between a node of emitters of the transistors $Q_{10}$ and $Q_{11}$ and a ground terminal, and two N-channel MOS transistors $Q_7$ and $Q_8$ each connected between each of the pre-bit lines SBL and $\overline{SBL}$ and a power terminal Vcc. The transistor $Q_{12}$ can be replaced by an NPN bipolar transistor and the transistors Q7 and Q8 can be replaced by resistors. Eight memory cells (MC1–MC8) in each cell block are connected in common to the pre-bit lines SBL and $\overline{SBL}$. Each of the memory cells MC includes, as well known in the art, two N-channel MOS transistors $Q_1$ and $Q_2$ which are cross-coupled in a flip-flop form, two resistors $R_1$ and $R_2$ each operating as a load and two N-channel MOS transistors $Q_3$ and $Q_4$ each operating as a transfer gate. The resistors $R_1$ and $R_2$ can be replaced by a P-channel MOS transistor, respectively.

According to the present embodiment, each pair of main bit lines e.g. MSB1 and $\overline{MSB1}$ are connected to collectors of only 32 transistors such as shown $Q_{10}$, $Q_{11}$, respectively, although 256 memory cells are arranged in each column, and therefore capacitance of each bit line is greatly reduced as compared to the conventional bit line structure in which transistors of all the memory cells of the same column are connected to each bit line. Also, in each of cell blocks such as CB 1-1, only eight transistors ($Q_3$, $Q_4$) are connected to each pre-bit line SBL, $\overline{SBL}$ and the capacitance of each pre-bit line is extremely small. It is favorable to fabricate the bit lines by a metal wiring layer formed on a semiconductor substrate via an insulating layer because such metal wiring formed on an insulating layer has a small stray capacitance. While the pre-bit lines SBL, $\overline{SBL}$ are advantageously formed by diffusion regions connected to sources or drains of the transistors $Q_3$, $Q_4$ of the memory cells in view of a high density arrangement of the memory cells in each cell block. The cell blocks are arranged in M columns and 32 rows and each cell block is identified by the designation $CB_{i-j}$ (i: address of columns, j: address of rows). Each word lines e.g. WL1 to WL8 are extending in parallel through M cell blocks of the same rows, e.g. CB 1-1 to CB M-1. M cell blocks of the same row are selected by a row group selection signal ($X_{1S}$–$X_{32}$) For example, the cell blocks of the first rows (CB 1-1 to CB M-1) are selected by the row group selection signal X1S so that each pair of bipolar transistors $Q_{10}$, $Q_{11}$ in the cell blocks CB 1-1 to CB M-1 are enabled by the transistor $Q_{12}$ rendered conductive.

The row group selection signals $X_{1S}$ to $X_{32S}$ are generated by decoding upper 5 bits of row address signals $RA_1$ to $RA_5$ by the row decoder 10. The row decoder 10 also decodes the remaining 3 bits of row address signals RA6 to RA8 to generate eight pre-selection signal and by performing AND logic operation of the eight pre-selection signals and each of the row group selection signals $X_{1S}$ to $X_{32S}$ generates selection signals $X_1$ to $X_{256}$ for 256 word lines $WL_1$–$WL_{256}$. For example, the signals $X_1$ to $X_8$ for selecting the word lines $WL_1$ to $WL_8$ extending through the cell blocks CB 1-1, CB 2-1 ... CB M-1 are generated by performing AND operation on the signal $X_{1S}$ and the eight pre-selection signals.

Figure 2:
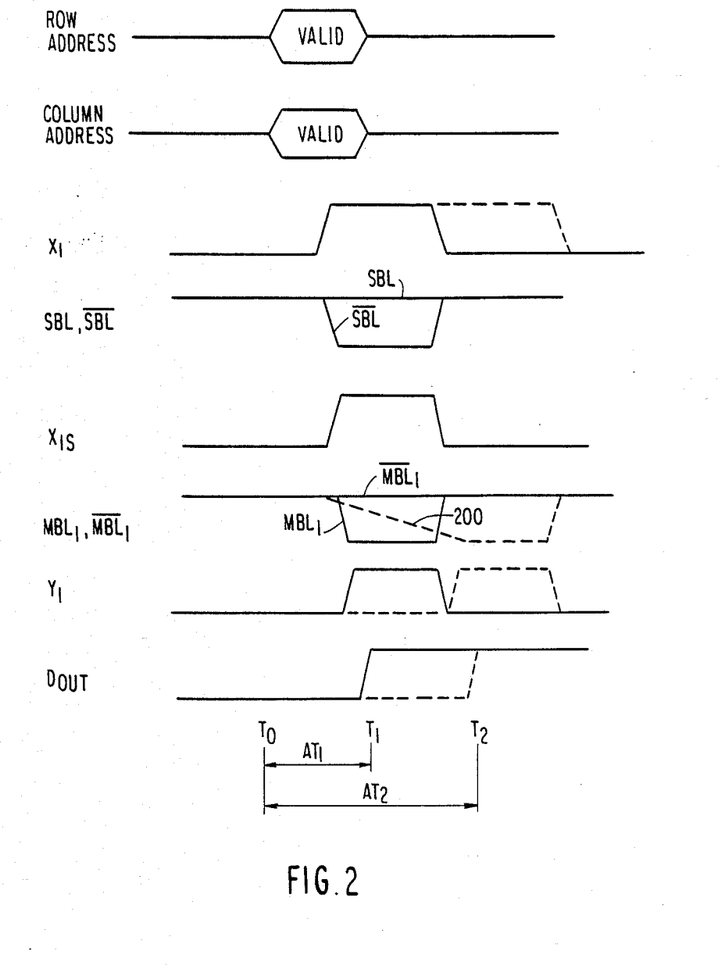
FIG. 2 is a timing chart representing a circuit operation of a memory shown in FIG. 1.

A data read operation will be described below with reference to FIG. 2. Valid row address signals $RA_1$ to $RA_8$ are supplied to row address terminals 10-1 to 10-8 at a time point $T_0$. The row address buffer/decoder/driver 10 responds to the valid row address data and changes one of the selection signals $X_1$ to $X_{256}$ to a high level. Assuming that the signal $X_1$ is changed to the high level, the word line $W_1$ is energized. The word line $WL_1$ has a relatively large stray capacitance, but the energizing thereof is completed for a short time since the row address buffer/ decoder/driver 10 has a BiCMOS construction to present a large current ability. The transistors $Q_3$ and $Q_4$ in the memory cell MC are thereby turned ON. Assuming that this memory cell MC stores a data "1" and the transistors $Q_1$ and $Q_2$ take thereby a non-conducting state and a conducting state, respectively, the complementary pre-bit line $\overline{SBL}$ is discharged by the transistor $Q_2$ via transistor $Q_4$ to lower the potential thereof, whereas the potential of the true pre-bit line SBL is held at the high level. Since only eight memory cells are connected to the pre-bit lines SBL and $\overline{SBL}$, the stray capacitance $C_{SB}$ thereof is very small. Therefore, the discharging of the complementary pre-bit line $\overline{SBL}$ is carried out with a small time constant, as shown in FIG. 2. The row address buffer/decoder/driver 10 further changes one of group selection selection signals $X_{1S}$ to $X_{32S}$ to the high level by making use of a part of the valid row address signals, i.e., $RA_I$ to $RA_5$. Each of the selection signals $X_{1S}$ to $X_{NS}$ is supplied to the gate of the transistor $Q_{12}$ in each of the cell blocks CB 1-1 to CB 1-32 (CB M-1 to CB M-32). Since the word line $WL_1$ is energized, the selection signal $X_{1S}$ is changed to the high level to select the cell block CB 1-1 (CB M-1), as shown in FIG. 2. The row address buffer/decoder/driver 10 generates the high level selection signal $X_{1S}$ after a little time delay from the generation of the high level selection signal $X_1$. The transistor $Q_{12}$ in the cell block CB 1-1 (CB M-1) is thereby turned ON. The transistor $Q_{12}$ operates, when turned ON, as a current source of a differential amplifier composed of the bipolar transistors $Q_{10}$ and $Q_{11}$. At this time, a potential difference has already occured between the bases of the transistors $Q_{10}$ and $Q_{11}$ by the lowering of the potential of the pre-bit line $\overline{SBL}$. The transistor $Q_{10}$ is thereby turned ON to discharge electric charges of the stray capacitance $C_{MB}$ of the true bit line $MBL_1$ along with the transistor $Q_{12}$. If the selected memory cell stores a data "0", the transistors $Q_{11}$ and $Q_{12}$ discharge the stray capacitor $C_{MB}$ of the complementary main-bit line $\overline{MBL}_1$. The transistors $Q_{10}$ and $Q_{11}$ are bipolar transistors and hence have a very large current ability as compared to a MOS transistor. Since each cell block has only one current source transistor represented by $Q_{12}$, this transistor can be formed with a relatively large size to produce a large current. As a result, the discharging of the true bit line $MBL_1$ is carried out rapidly, as shown in FIG. 2. When a bipolar transistor is employed as the transistor $Q_{12}$, the discharging time period of the bit line MBL ($\overline{MBL}$) is further shortened.

According to prior art, the memory cells MC arranged in the same column are connected in common to the main-bit lines MBL and $\overline{MBL}$ without transistors $Q_{10}$ and $Q_{11}$. Accordingly, the discharging of the bit line MBL ($\overline{MBL}$) is carried out by the MOS transistor $Q_1$ ($Q_2$) through the MOS transistor $Q_3$ ($Q_4$) and the column-selecting transistor The current ability of the MOS transistor is considerably smaller than the bipolar transistor when they are of the same size. Moreover, the transistors $Q_1$ to $Q_4$ constitute a memory cell MC and are therefore formed in a fine pattern to reduce the size of the memory cell. The current ability thereof is thus decreased more and more. As a result, the bit line $MBL_1$ is discharged with a very large time constant, as shown by a dotted line 200 in FIG. 2.

Turning back to the memory according to this embodiment, a column address buffer/decoder/driver 20 changes one of column selection signals $Y_1$ to $Y_{256}$ to the high level in response to valid column address signals $CA_1$ to $CA_8$ supplied to column address terminals 20-1 to 20-8. The column selection signals $Y_1$ to $Y_{256}$ are supplied to a column selection circuit 30. Assuming that the column address buffer/decoder/driver 20 produces the high level selection signal $Y_1$, the column selection circuit 30 selects the first true and complementary main-bit lines $MBL_1$ and $\overline{MBL}_1$ to transmit a potential difference therebetween to a sense amplifier/output circuit 40 of a Bi-CMOS construction. As a result, an output data "1" is produced from an output terminal 50 at a time point $T_1$, as shown in FIG. 2. Thus, an a time point $T_1$ that is before the time points $T_2$ and $T_3$, as shown in FIG. 2. An access time period of this memory is represented by $AT_0$ and is shorter than the period $AT_1$.

Figure 3:
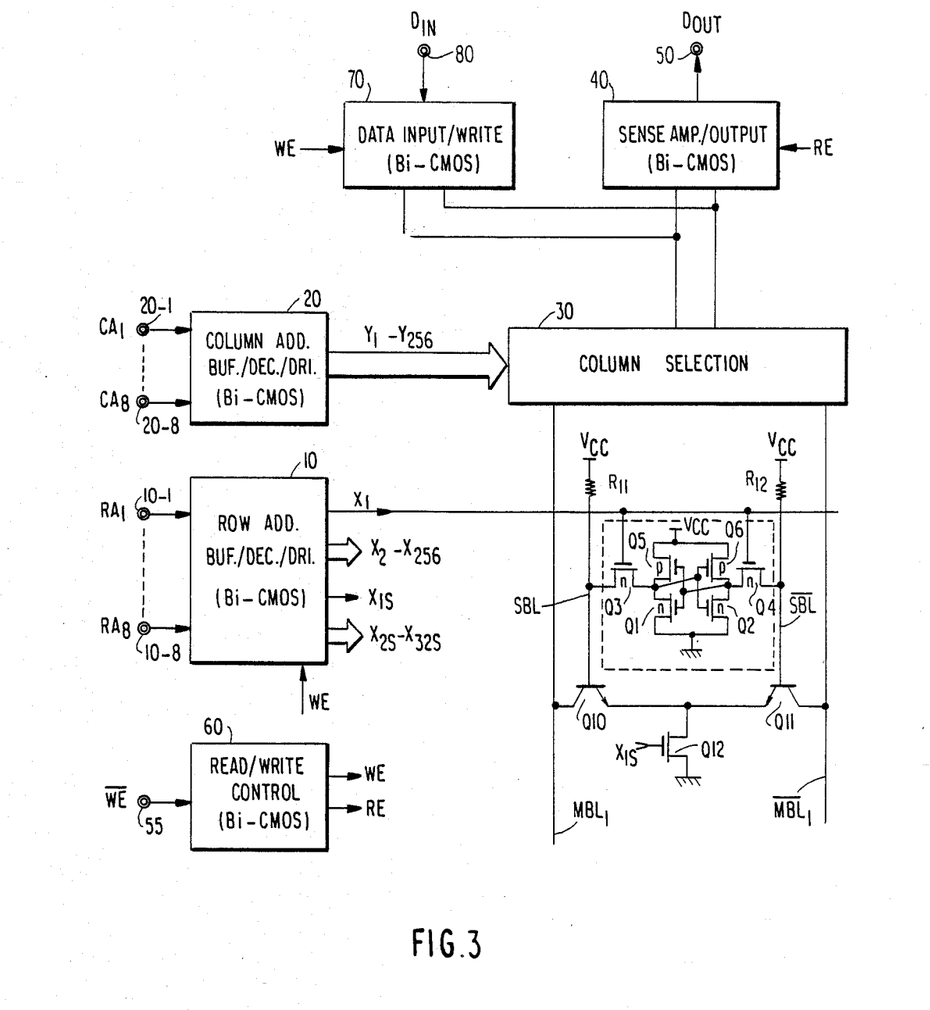
FIG. 3 is a block diagram showing a second embodiment of the present invention.

Referring to FIG. 3, a third embodiment of the present invention further includes a data write circuit, in which the same constituents as those shown in FIG. 1 are denoted by like numerals to omit their further description. It should be noted that only one memory cell is shown to avoid the complexity of the drawing. In the memory cell MC, P-channel MOS transistors $Q_5$ and $Q_6$ are employed in place of the load resistors $R_1$ and $R_2$ of FIG. 1 and resistors $R_{11}$ and $R_{12}$ are employed in place of the MOS transistors $Q_7$ and $Q_8$ of FIG. 1. In a data read operation, a write-enable signal $\overline{WE}$ taking the high level is supplied via a terminal 55 to a read/write control circuit 60 of a Bi-CMOS construction which then produces a high level read activating signal RE and a low level write activating signal WE. The sense amplifier/output circuit 40 is activated by the high level signal RE and a data input circuit/write circuit 70 is inactivated by the low level signal WE. As a result, the above-mentioned data read operation is carried out.

Figure 4:
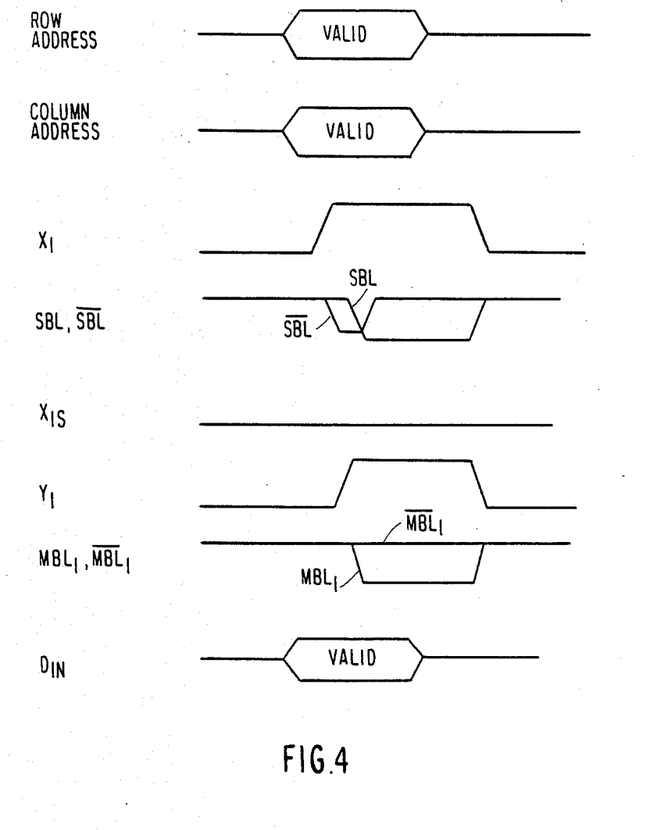
FIG. 4 is a timing chart representing a data write operation of a memory shown in FIG. 3.
Figure 5:
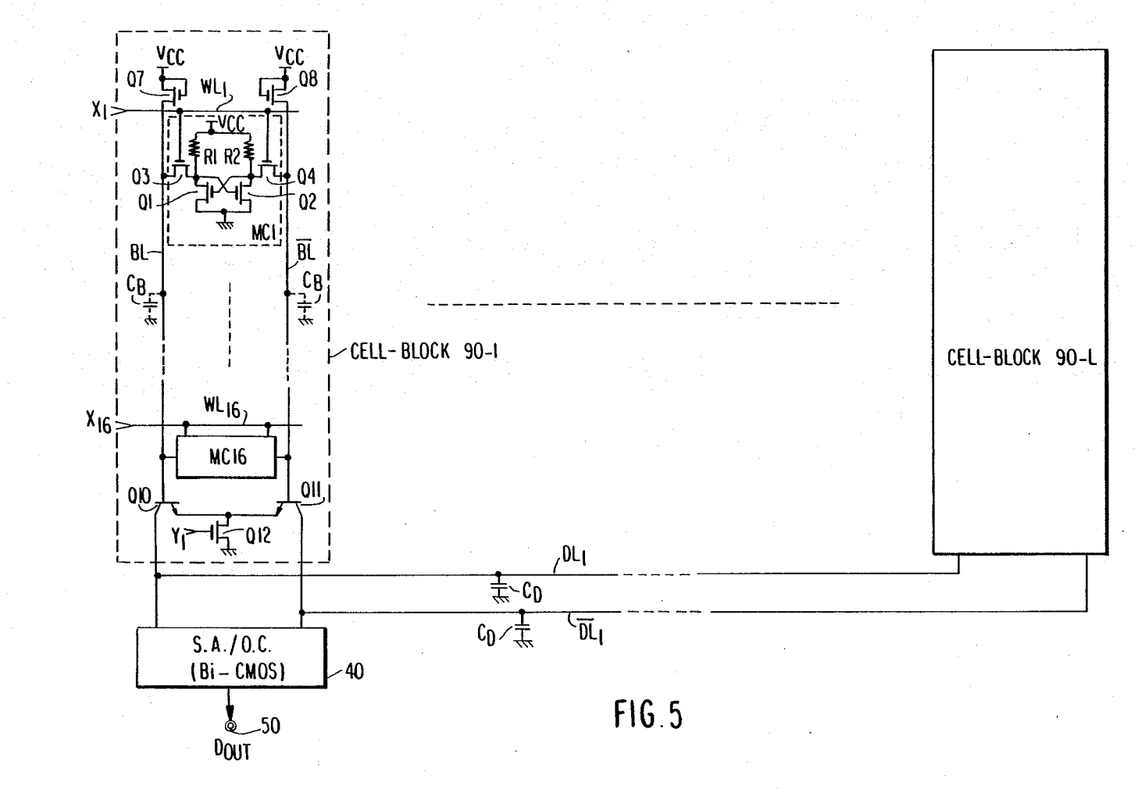
FIG. 5 is a block diagram representing a third embodiment of the present invention.

In the data write operation, the control signal $\overline{WE}$ takes the low level, and the control circuit 60 produces a low level read activating signal RE and a high level write activating signal WE. The data input circuit/write circuit 70 is thereby activated and the sense amplifier/ output circuit 40 is inactivated. As shown in FIG. 4, the row address buffer/decoder/driver 10 responds to valid row address signals $RA_1$ to $RA_8$ and changes the first row selection signal $X_1$ to the high level. The transistors $Q_3$ and $Q_4$ are thereby turned ON. Assuming that the memory cell MC has been storing the data "1", the transistor $Q_2$ discharges the complementary sub-bit line $\overline{BL}$ through the transistor $Q_4$ to lower the potential thereof. It should be noted that the lowered potential of the bit line $\overline{BL}$ takes not a low level (i.e., a ground level), but an intermediate level between the ground level and the $V_{cc}$ level, which is determined by the resistor $R_{12}$ and the conducting resistances of the transistors $Q_2$ and $Q_4$. In the data write mode, the row address buffer/decoder/driver 10 receives the high level write activating signal WE and hence does not energize the second row selection signal $X_{1S}$ to hold it at the low level, as shown in FIG. 3. The transistor $Q_{12}$ is thereby maintained in the non-conducting state. The valid column address signals $CA_i$ to $CA_j$ cause the column address buffer/decoder/driver 30 to produce the high level column selection signal $Y_1$. The column selection circuit 30 thereby connect the first cell block connected to the first pair of data lines $DL_1$ and true and complementary main-bit lines $MBL_1$ and $\overline{MBL}_1$ to the data input circuit/write circuit. Thus, the circuit 70 responds to a valid input data $D_1$ supplied to an input terminal 80 and changes one of the main-bit lines $MBL_1$ and $\overline{MBL}_1$ to the low (ground) level. In the case where the input data "0" is supplied, the true main-bit line $MBL_1$ is changed to the low level. The potential of true pre-bit line SBL is thereby lowered via the collector-base junction of the transistor $Q_{10}$ to such a potential that becomes lower than the potential of the complementary pre-bit line $\overline{SBL}$, as shown in FIG. 5. Since the complementary bit line $\overline{MBL}_1$ takes the high level, the collector-base junction of the transistor $Q_{11}$ is reverse-biased. When the potential of the true pre-bit line SBL becomes lower than that of the complementary pre-bit line $\overline{SBL}$, the transistors $Q_1$ and $Q_4$ are turned ON and those $Q_2$ and $Q_3$ are turned OFF. The potential of the complementary pre-bit line $\overline{SBL}$ is thus increased to the Vcc level by the transistor $Q_4$, as shown in FIG. 5. After the data writing, the bit lines $MBL_1$ and $\overline{MBL}_1$ are precharged to the Vcc level to reverse-bias the collector-base junctions of the transistors $Q_{10}$ and $Q_{11}$. The data written into the memory cell MC is thereby held.

With reference to FIG. 5, a Bi-CMOS SRAM according to a third embodiment employs column selection signals $Y_1$ to $Y_l$ as control signals for turning on transistors $Q_{12}$ in cell blocks 90-1 to 90-l, respectively. Each of cell blocks 90-1 to 90-l includes 16 memory cells $MC_1$ to $MC_{16}$, for example. The circuit construction of each cell block is similar to that of FIG. 1, and therefore the explanation thereof is omitted. The data read operation is also similar to FIG. 1.

The present invention is not limited to the abovementioned embodiment, but may be modified and changed without departing from the scope and spirit of the present invention.

What is claimed is:

1. A semiconductor memory comprising a pair of main-bit lines each having a first strong capacitance; a plurality of cell blocks, each of said cell blocks including a plurality of word lines, a pair of pre-bit lines each having a second strong capacitance, a plurality of memory cells each connected to one of said word lines and to said pre-bit lines, a first node connected to one of said main-bit lines, a second node connected to the other of said main-bit lines, a third node, a first transistor of a bipolar type having a base connected directly to one of said pre-bit lines and a collector-emitter current path connected between said first and third nodes, a second transistor of said bipolar type having a base connected directly to the other of said pre-bit lines and a collector-emitter current path connected between said second and third nodes, a third transistor connected between said third node and a reference point, each of said memory cells having fourth and fifth transistors of an insulated gate field effect type which are cross-coupled in a flip-flop form; and means responsive to a set of address signals for selecting one of said word lines and for turning on said third transistor in said one of said cell blocks, the number of said memory cells in each of said cell blocks being smaller than the number of said cell blocks to reduce said second stray capacitance and said first stray capacitance, wherein said second stray capacitance of one of said pre-bit lines is discharged through one of said fourth and fifth transistors and said first stray capacitance of one of said main-bit lines is discharged through one of first and second transistors and said third transistor.

2. The memory as claimed in claim 1, wherein said third transistor is of said insulated gate field effect transistor.

3. A semiconductor memory comprising at least one first line supplied with a first selection signal, a pair of second lines, at least one memory cell connected to said at least one first line and said second lines, a pair of third lines, a circuit node, a reference terminal, a first transistor of a bipolar type having a base connected to one of said second lines, a collector connected to one of said third lines and an emitter connected to said circuit node, a second transistor of said bipolar type having a base connected to the other of said third lines and an emitter connected to said circuit node, a third transistor connected between said circuit node and said reference terminal and receiving a second selection signal, means for operatively amplifying a first potential difference between said third lines caused by conducting states of said third transistor and one of said first and second transistors to produce an output data signal, and means responsive to an input data signal for operatively producing a second potential difference between said third lines while maintaining said third transistor in a non-conducting state, whereby said second potential difference appears between said second lines via collector-base junctions of said first and second transistor to write said input data signal into said memory cell.

4. The memory as claimed in claim 3, wherein said memory cell includes fourth and fifth transistors of an insulated gate field effect type which are cross-coupled in a flip-flop form.

5. The memory as claimed in claim 4, wherein said third transistor is of said insulated gate field effect type.

6. A semiconductor memory comprising a plurality of cell blocks arranged in a matrix form of a plurality of rows and columns, each of said cell blocks including a plurality of word lines each arranged in the row direction, a pair of pre-bit lines each arranged in the column direction, a plurality of memory cells of a static type, each of said memory cells being connected to one of said word lines and to said pre-bit lines, first, second and third nodes, a reference potential node, a first transistor of a bipolar type having a base connected directly to one of said pre-bit lines and a collector-emitter path connected between said first and third nodes, a second transistor of said bipolar type having a base connected directly to the other of said pre-bit lines and a collector-emitter path connected between said second and third nodes, and a third transistor connected between said third node and said reference point; a plurality of pairs of main-bit lines each arranged in the column direction, said first and second nodes of the cell blocks arranged in the same column being connected to the associated one of said pairs of main-bit lines, respectively; first means responsive to a set of first address signals and to a data read-enable signal for selecting one of said word lines in the respective ones of the cell blocks arranged in the same row and for turning said third transistor ON in said respective ones of the cell blocks arranged in the same row; second means coupled to said pairs of main-bit lines and responsive to a set of second address signals for selecting one of said pairs of main-bit lines, and third means responsive to said data read-enable signal for amplifying a potential difference appearing between the selected one of said pairs of main-bit lines to produce an output data signal.

7. The memory as claimed in claim 6, further comprising fourth means responsive to said set of first address signals and to a data write-enable signal for selecting one of said word lines in the respective ones of the cell blocks arranged in the same row while maintaining said third transistor OFF in all the cell blocks and fifth means responsive to said data write-enable signal and an input data signal for supplying a potential difference corresponding to said input data signal between said pre-bit lines through the selected one of said pairs of main-bit lines and collector-base junctions of said first and second transistors.

* * * * *

UNITED STATES PATENT AND TRADEMARK OFFICE
CERTIFICATE OF CORRECTION

PATENT NO. : 4,839,862
DATED : June 13, 1989
INVENTOR(S) : HIROSHI SHIBA et al

It is certified that error appears in the above-identified patent and that said Letters Patent is hereby corrected as shown below:

Column 2, line 22, delete "tee" and insert --the--.

Column 3, line 7, delete "Q7 and Q8" and insert --$Q_7$ and $Q_8$--.

Column 4, line 58, delete "(MBL) and insert --($\overline{MBL}$)--.

Column 5, line 15, delete "an" and insert --at--.

line 46, delete "X1" and insert --$X_1$--.

Signed and Sealed this

Third Day of April, 1990

Attest:

HARRY F. MANBECK, JR.

*Attesting Officer*  *Commissioner of Patents and Trademarks*